United States Patent [19]
DeBusk et al.

[11] Patent Number: 5,789,308
[45] Date of Patent: Aug. 4, 1998

[54] MANUFACTURING METHOD FOR WAFER SLICE STARTING MATERIAL TO OPTIMIZE EXTRINSIC GETTERING DURING SEMICONDUCTOR FABRICATION

[75] Inventors: Damon K. DeBusk. Austin; Bruce L. Pickelsimer. Pflugerville. both of Tex.

[73] Assignee: Advanced Micro Devices, Inc.. Sunnyvale. Calif.

[21] Appl. No.: 471,094

[22] Filed: Jun. 6, 1995

[51] Int. Cl.$^6$ .................................................. H01L 21/322
[52] U.S. Cl. ........................... 438/476; 438/699; 438/763
[58] Field of Search ............................. 437/12; 257/629, 257/634, 635, 641; 438/473, 476, 143, 759, 763, 692, 699

[56] References Cited

U.S. PATENT DOCUMENTS

| | | |
|---|---|---|
| 3,632,438 | 1/1972 | Richardson et al. ............ 117/215 |
| 3,650,854 | 3/1972 | Demsky et al. ................. 437/12 |
| 3,791,884 | 2/1974 | Dathe et al. .................... 437/12 |
| 4,279,671 | 7/1981 | Komatsu ......................... 437/12 |
| 4,370,180 | 1/1983 | Azuma et al. ................... 437/12 |
| 4,771,009 | 9/1988 | Ueki ............................... 437/12 |
| 5,223,734 | 6/1993 | Lowrey et al. .................. 437/12 |
| 5,374,842 | 12/1994 | Kusakabe ........................ 437/12 |
| 5,506,155 | 4/1996 | Kaigawa ......................... 437/12 |
| 5,516,706 | 5/1996 | Kusakabe ........................ 437/12 |
| 5,605,602 | 2/1997 | DeBusk .......................... 437/12 |

OTHER PUBLICATIONS

Runyan et al.. "Semiconductor Integrated Circuit Processing Technology", Addison–Wesley Publishing Co., (1990), pp. 428–442.

DeBusk et al., "Practical Gettering in High Temperature Processing", Semiconductor International, (May 1992).

Primary Examiner—Charles L. Bowers, Jr.
Assistant Examiner—Lynne A. Gurley
Attorney, Agent, or Firm—Kevin L. Daffer; Conley, Rose & Tayon

[57] ABSTRACT

A method of manufacturing a silicon substrate which optimizes extrinsic gettering during semiconductor fabrication is provided in which phosphorous ions are diffused into the backside surface of a silicon substrate during wafer slice manufacture. Forming gettering sites at the backside surface prior to gate polysilicon deposition, extrinsic gettering is optimized. Initially, both the frontside and backside surfaces of a silicon substrate are subjected to dopant materials. Thereafter, at least one thin film is formed on both the frontside and backside surfaces. The thin films are then removed from the frontside surface along with a layer of the silicon substrate immediately below the frontside surface to a depth of about 10.0 μm. The final polishing step of a typical silicon wafer manufacturing process removes a layer of silicon to a depth of about 10.0 μm at the frontside surface of the silicon wafer, thus allowing the wafer slice material manufacturing method of the present invention to be easily be incorporated into a standard silicon wafer manufacturing process. It is estimated that at least 99 percent of the dopants introduced into the frontside surface are removed with the upper 10.0 μm of silicon. The thin films formed on the backside surface of the silicon substrate remain, preventing outgassing of dopant impurities during subsequent thermal processing steps. A polysilicon thin film formed over the backside surface may also provide an additional source of extrinsic gettering.

15 Claims, 4 Drawing Sheets

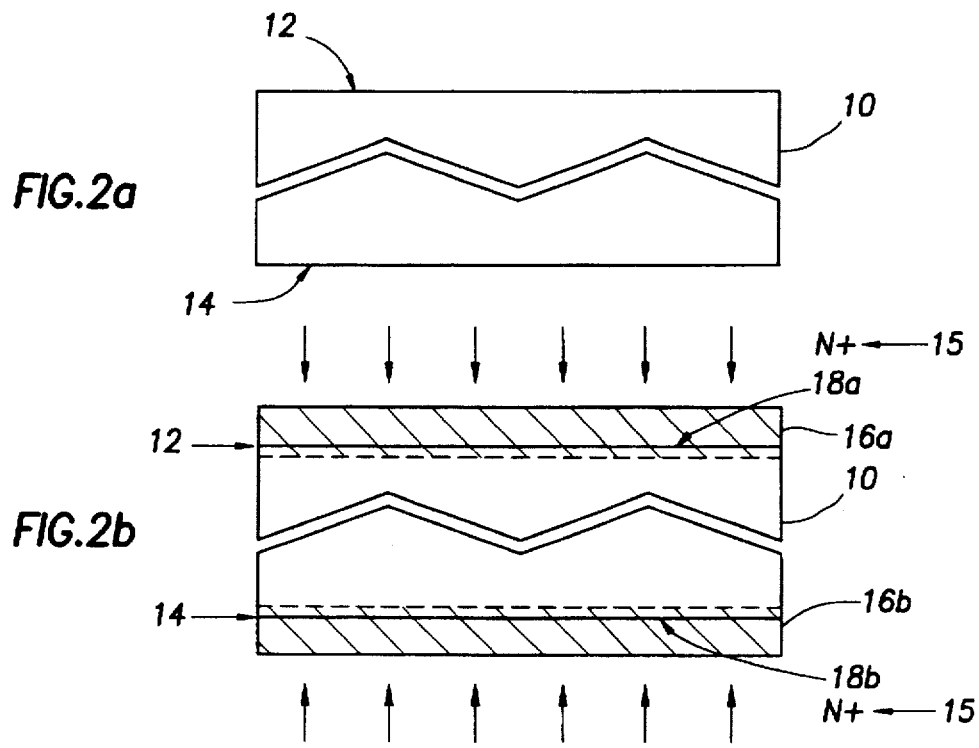
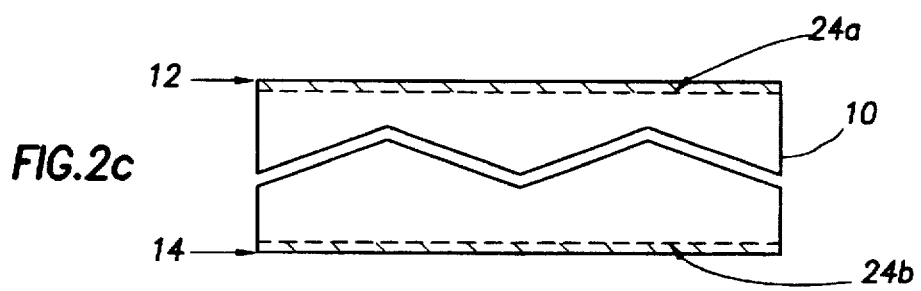
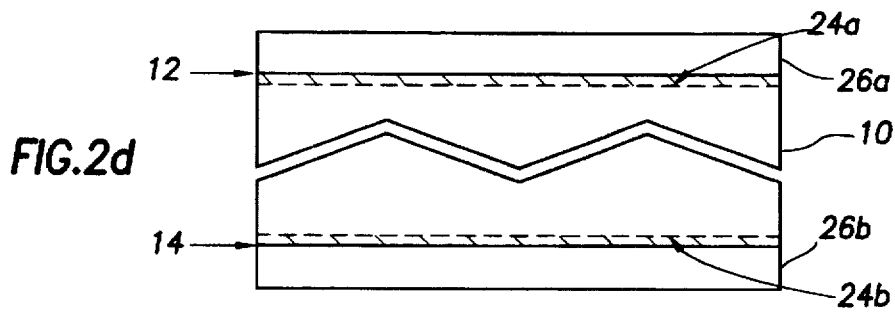
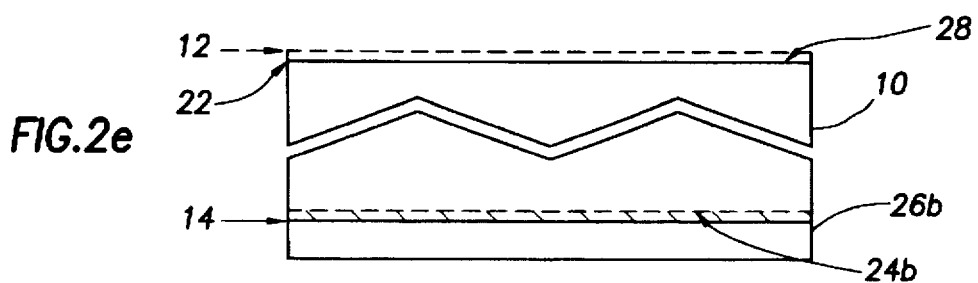

5,789,308

MANUFACTURING METHOD FOR WAFER SLICE STARTING MATERIAL TO OPTIMIZE EXTRINSIC GETTERING DURING SEMICONDUCTOR FABRICATION

BACKGROUND OF THE INVENTION

1. Field of the Invention

This invention relates to integrated circuit manufacture and more particularly to a method of manufacturing wafer slice starting material which incorporates an extrinsic gettering technique.

2. Description of the Relevant Art

Methods of gettering a silicon substrate are well known. Gettering is used to remove lifetime reducing contaminants (usually heavy metals) from regions of the circuit where their presence would degrade device performance. Most all the transition metals, such as gold, copper, iron, titanium, nickel, etc., are reported as possible lifetime reducing contaminants. It is desirable to reduce the presence of such contaminants in the active regions in order to reduce reverse junction leakage, improve bipolar transistor gain, and increase refresh time in dynamic metal oxide semiconductor (MOS) memories.

Lifetime reducing contaminants (heavy metals) may be introduced into a semiconductor substrate in a number of ways. First, heavy metal contaminants may be derived from processing equipment during wafer fabrication. For example, delivery lines are often made of stainless steel. Thus heavy metal atoms comprising stainless steel species may be introduced into a semiconductor substrate during wafer fabrication. The semiconductor substrate may also receive heavy metal ions during diffusion, ion implantation, chemical vapor deposition (CVD), plasma etching, and sputtering operations.

Second, heavy metal atoms are often derived from the conductive material placed on the frontside and backside surfaces of a semiconductor substrate. Frontside surface conductive material, generally referred to as "metallization", inherently uses heavy metal materials such as titanium and tungsten to enhance silicide growth and interconnect conductivity. A coating of gold is typically placed on the backside surface of a semiconductor substrate during the final stages of device fabrication to provide power supply conductivity to the semiconductor substrate, and also as an aid to bonding of the backside surface to the chip package. Heavy metals placed on the frontside and backside surfaces may migrate to the active regions and deleteriously effect circuit operations.

Gettering within the bulk of a semiconductor substrate is typically used to trap contaminants such as heavy metals at sites away from device active regions. There are two common forms of gettering: intrinsic gettering and extrinsic gettering.

Intrinsic gettering involves forming gettering sites in the bulk of a semiconductor substrate, generally below the active regions near the frontside surface of the semiconductor substrate. In silicon substrates (wafers) manufactured using the Czochralski (Cz) method, intrinsic gettering generally includes an initial denuding step (for wafers without silicon epitaxial layers) followed by a nucleation step, and then a precipitation step. Denudation, nucleation, and precipitation, in combination, form lattice dislocations in the silicon bulk below the active regions. The dislocations serve to trap heavy metal ions at the dislocation sites, away from the overlying active regions.

Extrinsic gettering, on the other hand, generally involves gettering near the backside surface of a silicon substrate. There are several methods used to perform extrinsic gettering. Two common methods include (i) diffusing phosphorous into the backside surface of a silicon wafer, and/or (ii) depositing polycrystalline silicon (polysilicon) on the backside surface of a silicon wafer. Diffusion processes utilizing extrinsic gettering techniques such as backside phosphorous diffusion and polysilicon deposition is described in Runyan, et al., *Semiconductor Integrated Circuit Processing Technology*, (Addison-Wesley Publishing Co., 1990), pp. 428–442; and, DeBusk, et al., "practical Gettering in High Temperature Processing", *Semiconductor International*, (May 1992) (both of which are herein incorporated by reference).

Extrinsic gettering is the subject of this application. Deposited doped polysilicon has become the standard gate electrode material for MOS transistors. In common silicon gate MOS processes, a gate polysilicon layer is deposited over a gate oxide layer early in the device fabrication process. An extrinsic gettering technique may take place before gate polysilicon is deposited, or may be combined with wafer fabrication steps after gate polysilicon deposition. As defined herein, initial semiconductor fabrication occurs prior to deposition of a layer of gate polysilicon. On the other hand, process-induced (or "in-process") extrinsic gettering techniques are combined with standard wafer fabrication operations which occur after gate polysilicon deposition.

Gettering techniques employed during initial semiconductor fabrication are potentially more effective than in-process techniques. Gettering sites produced during initial semiconductor fabrication have an opportunity to trap mobile contaminants away from the active device areas of the frontside surface of the silicon substrate before the wafer is subjected to any contaminants arising from normal processing flow. Any contaminants brought about by the process tool, or by operator involvement, will be obviated by the presence of pre-existing gettering sites.

Current backside surface phosphorous diffusion techniques involve placing silicon wafers on-edge in a wafer boat, and inserting the wafer boat into a diffusion furnace containing n-type dopants (i.e., phosphorous). Thus both the frontside and backside surfaces of silicon wafers are subjected to phosphorous ions in a diffusion furnace.

It is well known that "outgassing" of phosphorous impurities, introduced into the backside surface of a silicon wafer in an extrinsic gettering process, may contaminate active device regions on the frontside surface during subsequent processing steps such as thermal oxidation.

In common silicon gate MOS processes, phosphorus backside gettering is typically incorporated into wafer fabrication following deposition of the gate polysilicon layer over the gate oxide layer. The phosphorus, diffused into both the frontside and backside surfaces of the wafer, may thus provide extrinsic gettering at the backside surface as well as lower the electrical resistivity of the polysilicon layer at the frontside surface. The deleterious effects of any outgassing of phosphorus atoms from the backside surface during subsequent thermal processing steps are thus mitigated.

As with diffusion, conventional oxidation and polysilicon deposition processes typically involve placing silicon wafers on-edge in a wafer boat. Silicon wafers in the wafer boat may then be subjected to an oxidation or polysilicon deposition process. Thus both the frontside and backside surfaces of silicon wafers are simultaneously subjected to the same oxidation, or polysilicon deposition process ambient.

In a wafer fabrication process employing a process-induced extrinsic phosphorus gettering technique, phosphorus diffusion may occur after gate oxide growth and gate polysilicon deposition. During the gate oxide growth and gate polysilicon deposition processes, oxide and polysilicon layers are commonly formed on both sides of a silicon wafer. Gate oxides are typically about 100 angstroms thick. Phosphorous ions, however, cannot easily diffuse through an oxide layer more than about 70 angstroms thick. For this reason, any gate oxide and polysilicon layers deposited prior to phosphorus diffusion must be removed from the backside surface of a silicon wafer so that the backside silicon surface can receive backside phosphorous gettering.

A protective masking material must be placed on the frontside surface of a silicon wafer in order to remove the polysilicon and underlying gate oxide on the backside surface. The protective masking material (e.g., polymerized photoresist) prevents wet etch removal of the underlying polysilicon at the frontside surface of the silicon wafer while allowing removal of exposed polysilicon and gate oxide on the backside surface. Following the stripping of the photoresist from the frontside surface, a hydrofluoric acid solution is then used to remove the gate oxide layer from the backside surface of the silicon wafer.

The above steps of coating the frontside surface of a silicon wafer with photoresist, baking the photoresist, removing polysilicon, photoresist and oxide on the backside surface is not only time consuming, but also involves numerous expensive and caustic materials. Additionally, use of photoresist during early stages of wafer processing may reduce the effectiveness of subsequent photolithography and selective polysilicon removal. Still further, any additional use of photoresist should be avoided in a cleanroom environment since photoresist, and the removal thereof, is a relatively "dirty" procedure which can compromise cleanroom integrity.

It would thus be advantageous to provide an extrinsic gettering technique that may be employed during initial semiconductor fabrication, prior to high-temperature thermal cycles such as anneals which may increase the mobilities of contaminants. Not only would the steps of removing polysilicon and gate oxide from the backside surface of a wafer be eliminated, but the steps of coating the frontside surface with photoresist, baking the photoresist, and removing the photoresist would also be eliminated.

SUMMARY OF THE INVENTION

The problems outlined above are in large part solved by the wafer slice material manufacturing method of the present invention. Employing an extrinsic gettering technique during initial semiconductor fabrication, the method optimizes extrinsic gettering during semiconductor fabrication. Extrinsic gettering occurs prior to any high-temperature thermal cycles such as anneals which may increase the mobilities of contaminants.

The method of the present invention involves (i) subjecting a frontside and a backside surface of a silicon substrate to a source of phosphorus atoms, (ii) depositing one or more thin films on the frontside and backside surfaces of the silicon substrate, and (iii) removing all thin films from the frontside surface along with a layer of silicon to a depth of about 10.0 µm at the frontside surface of the silicon substrate. It is estimated that removing the layer of silicon to a depth of about 10.0 µm at the frontside surface of the silicon substrate also removes at least 99 percent of the phosphorus atoms introduced onto and into the frontside surface.

The final polishing step of a typical silicon wafer manufacturing process removes a layer of silicon to a depth of about 10.0 µm at the frontside surface of the silicon wafer. Thus the wafer slice material manufacturing method of the present invention may easily be incorporated into a standard silicon wafer manufacturing process. In this case, the steps of (i) subjecting a frontside and a backside surface of a silicon substrate to a source of phosphorus atoms and (ii) depositing one or more thin films on the frontside and backside surfaces of the silicon substrate may be carried out prior to the final polishing step of a typical silicon wafer manufacturing process. The final polishing step may accomplish step (iii) of the wafer slice material manufacturing method of the present invention, removing all thin films from the frontside surface along with a layer of silicon to a depth of about 10.0 µm at the frontside surface of the silicon substrate.

The thin films formed on the backside surface of the silicon substrate remain, preventing outgassing of dopant impurities during subsequent thermal processing steps. A thin film of polysilicon formed over the backside surface may provide an additional source of extrinsic gettering.

Phosphorous introduction onto and into the backside surface occurs prior to any barrier material, such as an oxide, being formed at backside surface. In a wafer fabrication process employing a process-induced extrinsic phosphorus gettering technique, phosphorus diffusion may occur after gate oxide growth and gate polysilicon deposition. In this case, a protective masking material must be placed on the frontside surface of a silicon wafer in order to remove the polysilicon and underlying gate oxide on the backside surface. Coating the frontside surface of a silicon wafer with photoresist, baking the photoresist, removing polysilicon, photoresist and oxide on the backside surface is not only time consuming, but also involves numerous expensive and caustic materials. Additionally, use of photoresist during early stages of wafer processing may reduce the effectiveness of subsequent photolithography and selective polysilicon removal. Still further, any additional use of photoresist should be avoided in a cleanroom environment since photoresist, and the removal thereof, is a relatively "dirty" procedure which can compromise cleanroom integrity.

Dopant impurities may be introduced through ion implantation or chemical diffusion. Unlike chemical diffusion where large numbers of wafers are processed in parallel, ion implantation involves processing of silicon substrates in series. Ion implantation and other slower alternative processes involving serial operations have been rejected in favor of processes in which many silicon substrates may be processed in parallel. The method of the present invention thus allows for high manufacturing throughput.

Broadly speaking, the present invention contemplates a method for manufacturing wafer slice starting material which optimizes extrinsic gettering of a silicon substrate. First, the frontside and backside surfaces of a silicon substrate are subjected to dopant materials. A layer of phosphorus pentoxide ($P_2O_5$) formed during a diffusion process involving phosphorus ions may then be removed from the frontside and backside surfaces of the silicon substrate. One or more thin films are then formed on both the frontside and backside surfaces to prevent dopant materials from leaving the backside surface and being deposited on or into the frontside surface of the silicon substrate during subsequent thermal processing steps. All thin films are then removed from the frontside surface along with a layer of the silicon substrate immediately below the frontside surface to a depth of about 10.0 µm. It is estimated that removing the layer of silicon about 10.0 μm in depth at the frontside surface of the silicon substrate also removes at least 99 percent of the phosphorus atoms introduced onto and into the frontside surface.

BRIEF DESCRIPTION OF THE DRAWINGS

Other objects and advantages of the invention will become apparent upon reading the following detailed description and upon reference to the accompanying drawings in which:

FIG. 2a is a partial cross-sectional view of a monolithic silicon substrate with a frontside surface and a backside surface.

FIG. 2b is a partial cross-sectional view of the silicon substrate of FIG. 2a undergoing a phosphorus diffusion operation and showing layers of phosphorus pentoxide ($P_2O_5$) on the frontside and backside surfaces resulting the thermal diffusion operation.

FIG. 2c is a partial cross-sectional view of the silicon substrate of FIG. 2b following removal of the $P_2O_5$ layers from the frontside and backside surfaces.

FIG. 2d is a partial cross-sectional view of the silicon substrate of FIG. 2c following deposition of capping layers of polysilicon or silicon nitride on the frontside and backside surfaces.

FIG. 2e is a partial cross-sectional view of the silicon substrate of FIG. 2d following removal of the capping layer and some of the silicon substrate at the frontside surface.

Figure 1A:
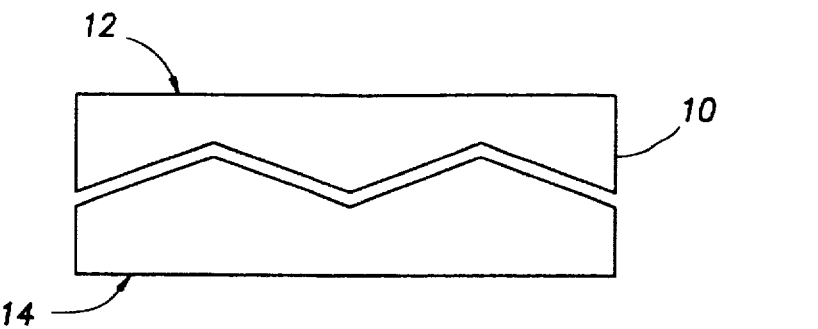
FIG. 1a is a partial cross-sectional view of a monolithic silicon substrate with a frontside surface and a backside surface.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1a shows a partial cross-sectional view of a monolithic silicon substrate 10 with a frontside surface 12 and a backside surface 14. Silicon substrate 10 may have a lattice structure arranged in any of several possible orientations (e.g., <111> or <100>).

Figure 1B:
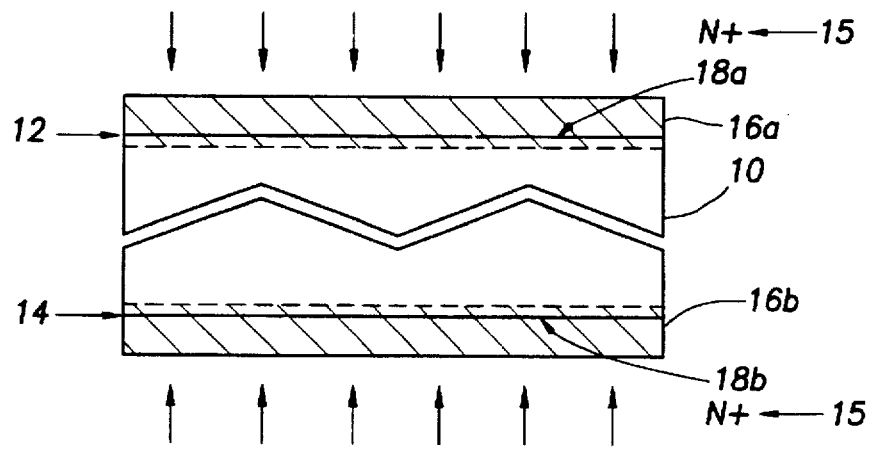
FIG. 1b is a partial cross-sectional view of the silicon substrate of FIG. 1a undergoing a phosphorus diffusion operation and showing layers of phosphorus pentoxide ($P_2O_5$) on the frontside and backside surfaces resulting the thermal diffusion operation.

The first step in a wafer slice manufacturing method which optimizes extrinsic gettering includes subjecting silicon substrate 10 to n-type phosphorus ions. FIG. 1b shows both frontside surface 12 and backside surface 14 of silicon substrate 10 being subjected to phosphorus ions 15. Phosphorus ions 15 diffuse onto or into frontside surface 12 and onto and into backside surface 14 of silicon substrate 10. The phosphorus ions 15 which diffuse into exposed backside surface 14 of silicon substrate 10 provide an extrinsic gettering source at backside surface 14.

The diffusion of phosphorus ions is preferably carried out in a diffusion furnace according to common diffusion techniques. Common diffusion techniques involve placing silicon wafers on-edge in a wafer boat, and inserting the wafer boat into a diffusion furnace. Thus both frontside surface 12 and backside surface 14 are simultaneously subjected to phosphorous ions.

During the thermal diffusion operation, thin layers of phosphorus pentoxide ($P_2O_5$) may be formed on both frontside surface 12 and backside surface 14 of silicon substrate 10. Such $P_2O_5$ layers may be formed in a diffusion furnace containing phosphine ($PH_3$) and oxygen ($O_2$) through the following reaction:

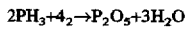

Alternately, the $P_2O_5$ layers may be formed in a diffusion furnace containing phosphorus oxychloride ($POCl_3$) and oxygen ($O_2$) through the following reaction:

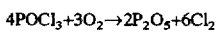

FIG. 1b shows a $P_2O_5$ layer 16a formed on frontside surface 12 of silicon substrate 10, and a $P_2O_5$ layer 16b formed on backside surface 14 of silicon substrate 10 during thermal diffusion.

As frontside surface 12 and backside surface 14 of silicon substrate 10 are subjected to phosphorus ions 15, areas of high phosphorus ion concentration 18a and 18b are created. As shown in FIG. 1b, area of high phosphorus concentration 18a includes $P_2O_5$ layer 16a and extends through frontside surface 12 and into substrate 10. Similarly, area of high phosphorus concentration 18b includes $P_2O_5$ layer 16b and extends through backside surface 14 and into substrate 10.

Regarding area of high phosphorus concentration 18a, phosphorus ion concentration is highest in $P_2O_5$ layer 16a and at frontside surface 12 of silicon substrate 10, and decreases with increasing depth from frontside surface 12 into substrate 10. Similarly, regarding area of high phosphorus concentration 18b, phosphorus ion concentration is highest in P$_2$O$_5$ layer 16b and at backside surface 14 of silicon substrate 10, and decreases with increasing depth from backside surface 14 into substrate 10.

Figure 1C:
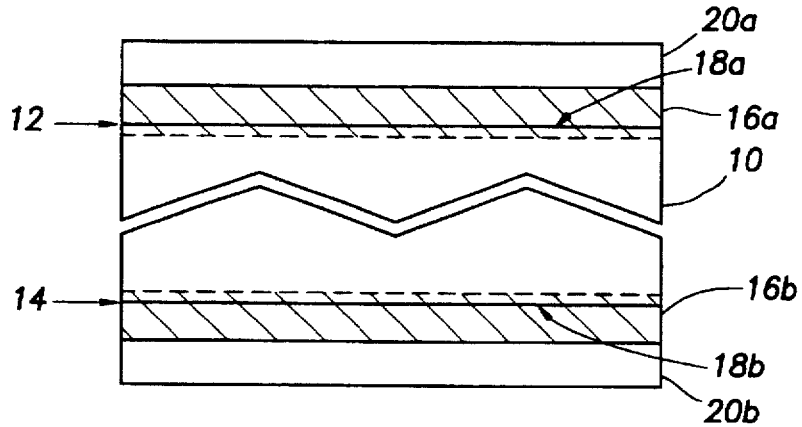
FIG. 1c is a partial cross-sectional view of the silicon substrate of FIG. 1b following deposition of capping layers of polysilicon or silicon nitride over the $P_2O_5$ layers on the frontside and backside surfaces.

The second step in a wafer slice manufacturing method which optimizes extrinsic gettering preferably involves the formation of capping layers of polysilicon or silicon nitride over P$_2$O$_5$ layers 16a and 16b. FIG. 1c shows a capping layer 20a over P$_2$O$_5$ layer 16a on frontside surface 12 of silicon substrate 10, and a capping layer 20b over P$_2$O$_5$ layer 16b on backside surface 14 of silicon substrate 10.

Capping layers 20a and 20b of polysilicon (Si) may be formed according to common CVD procedures in a CVD chamber containing silane (SiH$_4$) and at temperatures typically between 600° C. and 650° C. through the following reaction:

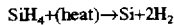

$$SiH_4 + (heat) \rightarrow Si + 2H_2$$

Capping layers 20a and 20b of silicon nitride (Si$_3$N$_4$) may be formed according to common CVD procedures in a CVD chamber containing dichlorosilane (SiH$_2$Cl$_2$) and ammonia (NH$_3$) and at temperatures typically between 700° C. and 750° C. through the following reaction:

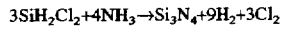

$$3SiH_2Cl_2 + 4NH_3 \rightarrow Si_3N_4 + 9H_2 + 3Cl_2$$

Capping layers 20a and 20b may be formed simultaneously over P$_2$O$_5$ layers 16a and 16b, respectively, by placing silicon substrate 10 on-edge in a wafer boat, and inserting the wafer boat into a CVD chamber.

When capping layer 20a and P$_2$O$_5$ layer 16a are removed in the next step, capping layer 20b over P$_2$O$_5$ layer 16b will serve to seal P$_2$O$_5$ layer 16b and backside surface 14 of silicon substrate 10, thus preventing dopant materials from outgassing from area of high phosphorus concentration 18b and contaminating the frontside surface during subsequent thermal processing steps.

Figure 1D:
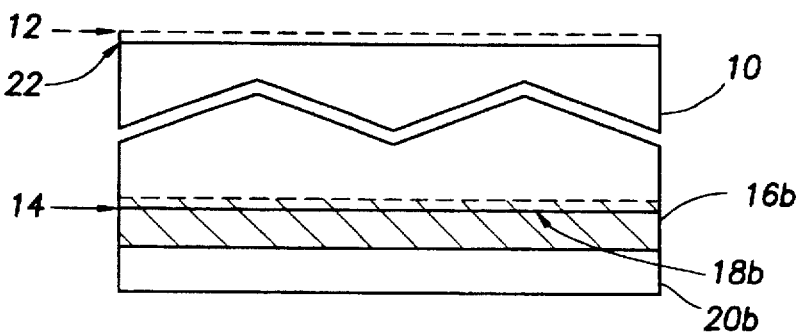
FIG. 1d is a partial cross-sectional view of the silicon substrate of FIG. 1c following removal of the capping layer, the $P_2O_5$ layer, and some of the silicon substrate at the frontside surface.

The next step in a wafer slice manufacturing method which optimizes extrinsic gettering involves the removal of capping layer 20a, P$_2$O$_5$ layer 16a, and some of silicon substrate 10 from frontside surface 12 down to a depth of about 10.0 µm. FIG. 1d shows silicon substrate 10 after removal of capping layer 20a, P$_2$O$_5$ layer 16a, and some of silicon substrate 10 at frontside surface 12 down to a depth of about 10.0 µm. A new frontside surface 22 is formed which is about 10.0 µm below original frontside surface 12. Capping layer 20b over P$_2$O$_5$ layer 16b on backside surface 14 of silicon substrate 10 remains, as does area of high phosphorus concentration 18b.

A plasma dry etch process may be used to remove capping layer 20a, P$_2$O$_5$ layer 16a, and some of silicon substrate 10 at frontside surface 12 down to a depth of about 10.0 µm. Alternately, capping layer 20a, P$_2$O$_5$ layer 16a, and some of silicon substrate 10 at frontside surface 12 down to a depth of about 10.0 µm may be removed by a mechanical grinding, lapping, buffing, or polishing process. If desired, a chemical etchant may be added to the mechanical grinding, lapping, buffing or polishing technique to enhance the process.

With the removal of some of silicon substrate 10 at frontside surface 12 down to a depth of about 10.0 µm, forming new frontside surface 22, it is estimated that at least 99 percent of the phosphorus atoms introduced onto and into frontside surface 12 of silicon substrate 10 are removed. As mentioned above, capping layer 20b of polysilicon or silicon nitride over remaining P$_2$O$_5$ layer 16b serves to seal P$_2$O$_5$ layer 16b and backside surface 14 of silicon substrate 10, thus preventing dopant materials from outgassing and contaminating frontside surface 12 during subsequent thermal processing steps.

In a second embodiment, P$_2$O$_5$ layers formed on the frontside and backside surfaces of silicon substrate 10 may be removed prior to deposition of capping layers. FIGS. 2a–2e will be used to describe the steps involved in this second embodiment.

FIG. 2a shows a partial cross-sectional view of a monolithic silicon substrate 10 with a frontside surface 12 and a backside surface 14. Silicon substrate 10 may have a lattice structure arranged in any of several possible orientations (e.g., <111> or <100>). FIG. 2b illustrates both frontside surface 12 and backside surface 14 of silicon substrate 10 being subjected to phosphorus ions.

Silicon substrate 10 is preferably subjected to phosphorus ions in a diffusion furnace according to common diffusion procedures using phosphine (PH$_3$) or phosphorus oxychloride (POCl$_3$). Common diffusion techniques involve placing silicon wafers on-edge in a wafer boat, and inserting the wafer boat into a diffusion furnace. As shown in FIG. 2b, both frontside surface 12 and backside surface 14 are simultaneously subjected to phosphorous ions. P$_2$O$_5$ layers 16a and 16b may be formed simultaneously on frontside surface 12 and backside surface 14, respectively, during the thermal diffusion process.

As frontside surface 12 and backside surface 14 of silicon substrate 10 are subjected to phosphorus ions 15, areas of high phosphorus ion concentration 18a and 18b are created. As shown in FIG. 2b, area of high phosphorus concentration 18a includes P$_2$O$_5$ layer 16a and extends through frontside surface 12 and into substrate 10. Similarly, area of high phosphorus concentration 18b includes P$_2$O$_5$ layer 16b and extends through backside surface 14 and into substrate 10.

FIG. 2c depicts the next step of removing the P$_2$O$_5$ layers from both the frontside and backside surfaces. Specifically, FIG. 2c illustrates silicon substrate 10 after removal of P$_2$O$_5$ layer 16a from frontside surface 12 and P$_2$O$_5$ layer 16b from backside surface 14. P$_2$O$_5$ layers 16a and 16b may be removed using wet or dry chemical etch processes.

After removal of P$_2$O$_5$ layer 16a from frontside surface 12, a portion of area of high phosphorus concentration 18a remains as phosphorus region 24a. Similarly, after removal of P$_2$O$_5$ layer 16b from backside surface 14, a portion of area of high phosphorus concentration 18b remains as phosphorus region 24b.

According to a subsequent step, FIG. 2d shows a capping layer 26a of polysilicon or silicon nitride formed on frontside surface 12 of silicon substrate 10, and a capping layer 26b of polysilicon or silicon nitride formed on backside surface 14 of silicon substrate 10. Capping layers 26a and 26b are preferably formed simultaneously over the exposed surfaces of phosphorous layers 24a and 24b using a CVD process.

The next step in a second embodiment of a wafer slice manufacturing method which optimizes extrinsic gettering involves plasma removal of capping layer 26a and some of silicon substrate 10 at frontside surface 12 down to a depth of about 10.0 µm. Alternatively, capping layer 26a and part of silicon substrate 10 may be removed using a mechanical technique. FIG. 2e shows silicon substrate 10 after removal of capping layer 26a and some of silicon substrate 10 at frontside surface 12 down to a depth of about 10.0 µm. A new frontside surface 22 is formed which is about 10.0 µm below original frontside surface 12. Capping layer 26b on backside surface 14 of silicon substrate 10 remains, as does phosphorus region 16b. As mentioned above, it is estimated that at least 99 percent of the dopants are removed with the upper layer of silicon.

The backside capping layer 26b of polysilicon or silicon nitride remains over backside surface 14 to prevent dopant materials from outgassing and contaminating the new frontside surface 22. A capping layer 26b of polysilicon, in direct contact with backside surface 14 of silicon substrate 10, may serve to provide an additional source of extrinsic gettering at backside surface 14.

It shall be noted that phosphorus atoms located on and in $P_2O_5$ layer 16b were subsequently removed when $P_2O_5$ layer 16b was removed in the second embodiment. Accordingly, the level of extrinsic gettering provided by the second embodiment may be lower than the level provided by the first embodiment in which $P_2O_5$ layer 16b remains in place. Also as a direct result, the required thickness of capping layer 26b used to seal backside surface 14 in the second embodiment may be less than the required thickness of capping layer 20b of the first embodiment.

Figure 3A:
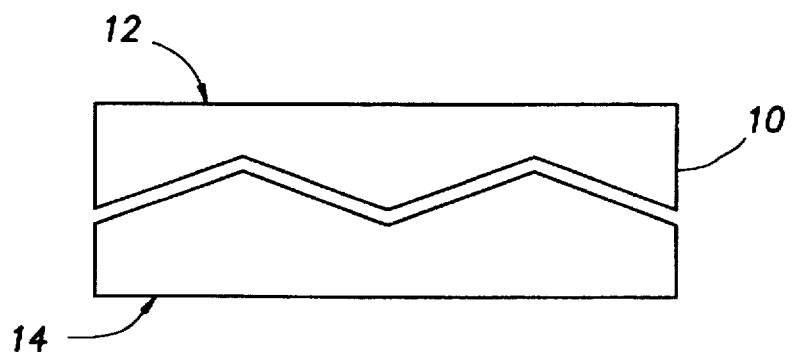
FIG. 3a shows a partial cross-sectional view of a monolithic silicon substrate with a frontside surface and a backside surface.
Figure 3B:
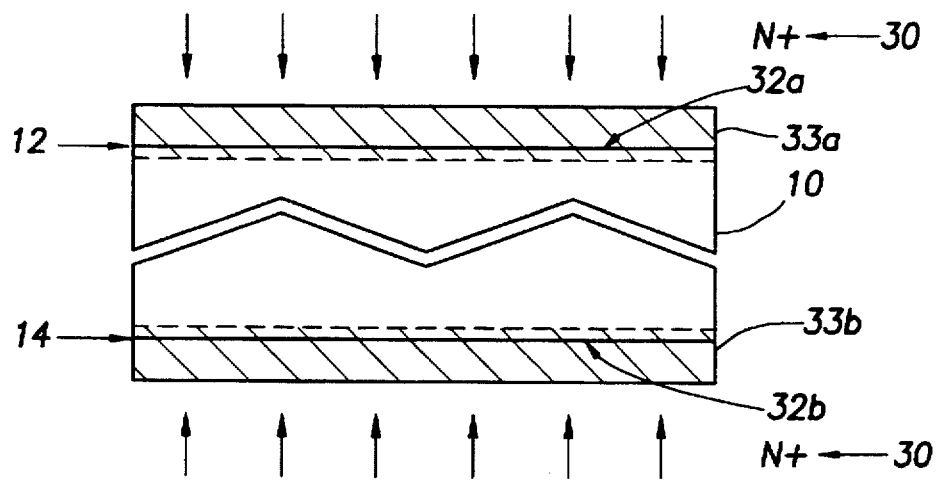
FIG. 3b is a partial cross-sectional view of the silicon substrate of FIG. 3a undergoing a phosphorus diffusion operation and showing layers of phosphorus pentoxide ($P_2O_5$) on the frontside and backside surfaces resulting the thermal diffusion operation.

FIGS. 3a–3e will be used to describe the steps involved in a third embodiment. FIG. 3a shows a partial cross-sectional view of a monolithic silicon substrate 10 arranged in one of several possible orientations. FIG. 3b depicts both frontside surface 12 and backside surface 14 of silicon substrate 10 being subjected to phosphorus ions 30.

Silicon substrate 10 is preferably subjected to phosphorus ions in a diffusion furnace according to common diffusion procedures using phosphine ($PH_3$) or phosphorus oxychloride ($POCl_3$). Common diffusion techniques involve placing silicon wafers on-edge in a wafer boat, and inserting the wafer boat into a diffusion furnace. Thus both frontside surface 12 and backside surface 14 are simultaneously subjected to phosphorous ions. $P_2O_5$ layers 33a and 33b may be formed simultaneously on frontside surface 12 and backside surface 14, respectively, during the thermal diffusion process.

Phosphorus regions 32a and 32b are formed as silicon substrate 10 is subjected to phosphorus ions. Phosphorus region 32a includes $P_2O_5$ layer 33a, frontside surface 12, and extends through frontside surface 12 into substrate 10. Similarly, phosphorus region 32b includes $P_2O_5$ layer 33b, backside surface 14, and extends through backside surface 14 into substrate 10. Phosphorus ion concentration is highest in and on $P_2O_5$ layers 33a and 33b, and on frontside surface 12 and backside surface 14 of silicon substrate 10. Phosphorus ion concentration decreases with increasing depth into silicon substrate 10 from frontside surface 12 and from backside surface 14.

Figure 3C:
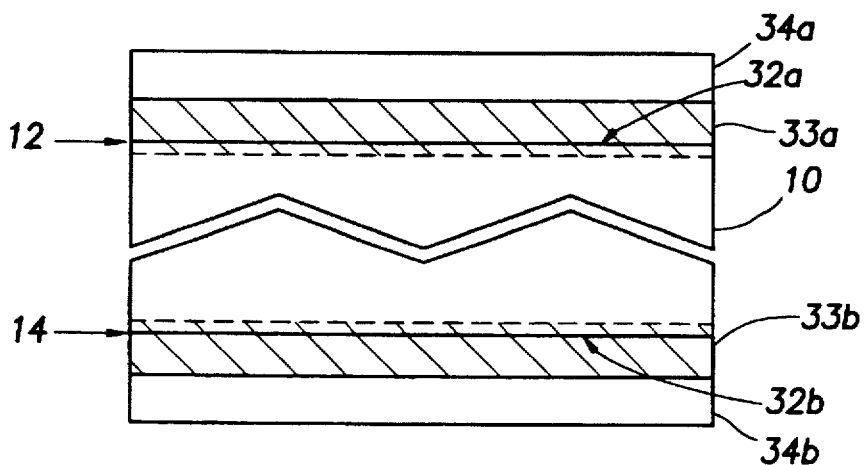
FIG. 3c is a partial cross-sectional view of the silicon substrate of FIG. 3b following deposition of capping layers of polysilicon or silicon nitride over the $P_2O_5$ layers on the frontside and backside surfaces.

The next step in the third embodiment of a wafer slice manufacturing method which optimizes extrinsic gettering involves the formation of capping layers of polysilicon or silicon nitride on $P_2O_5$ layers 33a and 33b on frontside surface 12 and backside surface 14 of silicon substrate 10. FIG. 3c shows a capping layer 34a of polysilicon or silicon nitride on $P_2O_5$ layer 33a on frontside surface 12 of silicon substrate 10, and a capping layer 34b of polysilicon or silicon nitride on $P_2O_5$ layer 33b on backside surface 14 of silicon substrate 10. Capping layers 34a and 34b are preferably simultaneously formed according to common CVD procedures described hereinabove.

Figure 3D:
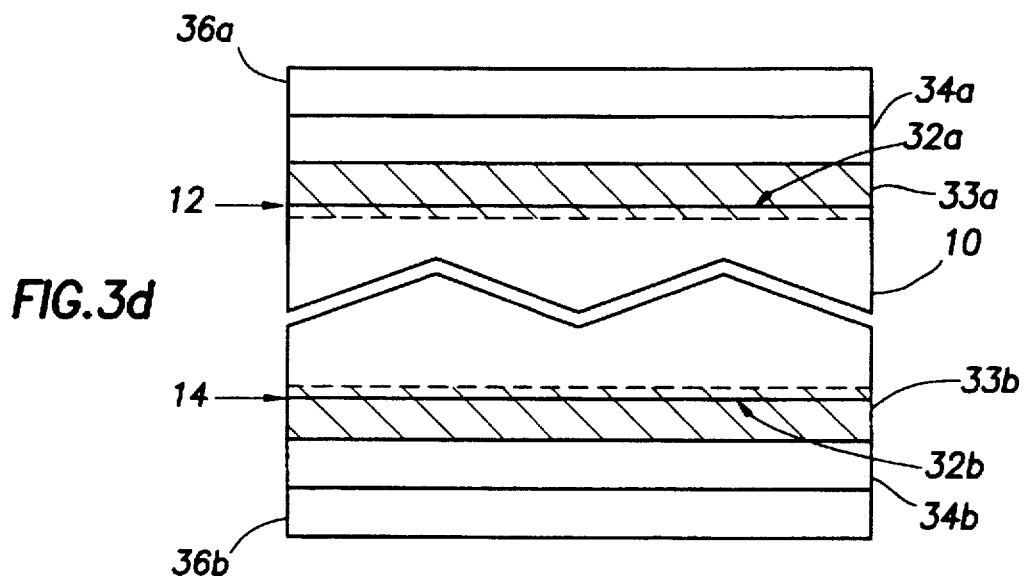
FIG. 3d is a partial cross-sectional view of the silicon substrate of FIG. 3c following deposition of oxide layers over the capping layers on the frontside and backside surfaces.

The next step in a third embodiment of a wafer slice manufacturing method which optimizes extrinsic gettering involves the formation of layers of silicon dioxide (oxide) on top of the capping layers. FIG. 3d shows an oxide layer 36a on capping layer 34a on $P_2O_5$ layer 33a on frontside surface 12, and an oxide layer 36b on capping layer 34b on $P_2O_5$ layer 33b on backside surface 14.

Oxide layers 36a and 36b are preferably simultaneously formed according to common CVD deposition procedures.

Oxide layers 36a and 36b may be formed in a CVD chamber containing silane ($SiH_4$) and oxygen ($O_2$) at temperatures of less than about 500° C. through the following reaction:

$$SiH_4+O_2 \rightarrow SiO_2+2H_2$$

The next step in a third embodiment of a wafer slice manufacturing method which optimizes extrinsic gettering includes the removal of oxide layer 36a, capping layer 34a, $P_2O_5$ layer 33a, and some of silicon substrate 10 at frontside surface 12 down to a depth of about 10.0 μm. The oxide, capping layer, and substrate silicon may be removed using any chemical removal, mechanical removal, or a combination or chemical and mechanical removal techniques.

Figure 3E:
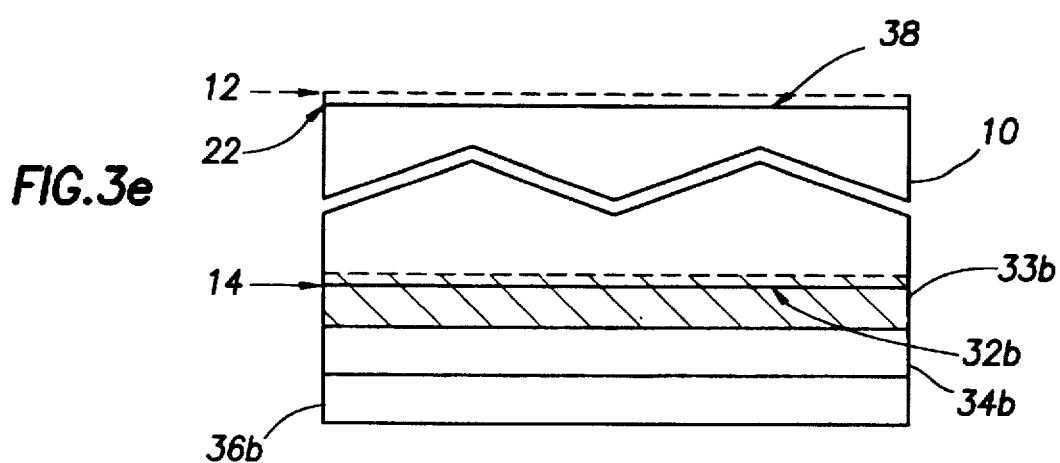
FIG. 3e is a partial cross-sectional view of the silicon substrate of FIG. 3d following removal of the oxide layer, the capping layer, the $P_2O_5$ layer, and some of the silicon substrate at the frontside surface.

FIG. 3e shows silicon substrate 10 after removal of oxide layer 36a, capping layer 34a, $P_2O_5$ layer 33a, and some of silicon substrate 10 at frontside surface 12 down to a depth of about 10.0 μm. The new frontside surface is estimated to be void of at least 99 percent of the phosphorous atoms introduced with phosphorous region 32a.

Removal of some of silicon substrate 10 at frontside surface 12 forms a new frontside surface 22 which is about 10.0 μm below the elevation of original frontside surface 12. Oxide layer 36b, capping layer 34b, and $P_2O_5$ layer 33b on backside surface 14 of silicon substrate 10 remain, as does phosphorus region 32b. Oxide layer 36b and capping layer 34b serve to seal $P_2O_5$ layer 33b and backside surface 14, preventing outgassing of dopant materials during subsequent thermal processing steps. As before, a capping layer 34b of polysilicon may provide an additional source of extrinsic gettering.

By achieving phosphorous diffusion into backside surface 14 of silicon substrate 10 prior to gate polysilicon deposition, the method of the present invention achieves extrinsic gettering at backside surface 14 during wafer slice manufacturing. Phosphorous atoms are introduced onto and into both frontside surface 12 and backside surface 14 of silicon substrate 10 through a variety of methods. One or more thin films are then formed over frontside surface 12 and backside surface 14 of silicon substrate 10. The thin films over frontside surface 12 are subsequently removed, along with some of silicon substrate 10 at frontside surface 12 down to a depth of about 10.0 μm. A new frontside surface 22 is formed which is about 10.0 μm below original frontside surface 12.

The thin films on backside surface 14 of silicon substrate 10 remain, one or more of which prevent outgassing of dopant impurities during subsequent thermal processing steps. A polysilicon capping layer over backside surface 14 of silicon substrate 10 may also provide an additional source of extrinsic gettering.

In addition, phosphorous introduction on and into backside surface 14 occurs prior to any barrier material, such as an oxide, being formed at backside surface 14, and also before substrate 10 undergoes any thermal cycles such as anneals which may increase the mobilities of contaminants.

Dopant impurities may be introduced through ion implantation or chemical diffusion. Unlike chemical diffusion where large numbers of wafers are processed in parallel, ion implantation involves processing of silicon substrates in series. Ion implantation and other slower alternative processes involving serial operations have been rejected in favor of processes in which many silicon substrates may be processed in parallel. The method of the present invention thus allows for high manufacturing throughput.

It will be appreciated to those skilled in the art after having the benefit of this disclosure that this invention is believed to be capable of applications with any integrated circuit embodied upon a silicon substrate. Furthermore, it is also to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and change and, accordingly, the specification and drawings are to be regarded in an illustrative rather than a restrictive sense.

What is claimed is:

1. A method of manufacturing a silicon substrate which optimizes extrinsic gettering during semiconductor fabrication, comprising the steps of:

subjecting a frontside surface and a backside surface of said silicon substrate to dopant materials;

subsequent to said subjecting, forming at least one layer upon the frontside surface and the backside surface of the silicon substrate for the purpose of sealing the backside surface against dopant material outgassing during subsequent thermal processing steps; and removing all layers from the frontside surface of the silicon substrate along with a layer of the silicon substrate immediately below the frontside surface.

2. The method as recited in claim 1, wherein the step of subjecting a frontside surface and a backside surface of said silicon substrate to dopant materials comprises inserting the silicon substrate into a wafer boat and introducing the wafer boat into a diffusion furnace such that the frontside and backside surfaces of the silicon substrate are exposed to dopant materials within the diffusion furnace.

3. The method as recited in claim 2, wherein the dopant materials comprise a source of phosphorus ions.

4. The method as recited in claim 3, wherein the diffusion furnace contains oxygen ($O_2$).

5. The method as recited in claim 4, wherein the step of forming at least one layer upon the frontside surface and the backside surface of the silicon substrate comprises depositing a layer of polycrystalline silicon (polysilicon) upon the frontside surface and the backside surface of the silicon substrate.

6. The method as recited in claim 4, wherein the step of forming at least one layer upon the frontside surface and the backside surface of the silicon substrate comprises depositing a layer of silicon nitride upon the frontside surface and the backside surface of the silicon substrate.

7. The method as recited in claim 1, wherein said removing step comprises etching removal of all layers from the frontside surface of the silicon substrate along with a layer of the silicon substrate immediately below the frontside surface to a depth of about 10.0 µm.

8. The method as recited in claim 1, wherein said removing step comprises grinding removal of all layers from the frontside surface of the silicon substrate along with a layer of the silicon substrate immediately below the frontside surface to a depth of about 10.0 µm.

9. The method as recited in claim 1, wherein said removing step comprises polishing removal of all layers from the frontside surface of the silicon substrate along with a layer of the silicon substrate immediately below the frontside surface to a depth of about 10.0 µm.

10. A method of manufacturing a silicon substrate which optimizes extrinsic gettering during semiconductor fabrication, comprising the steps of:

subjecting a frontside surface and a backside surface of said silicon substrate to phosphorus ions in a diffusion chamber containing oxygen ($O_2$), during which a layer of phosphorus pentoxide $P_2O_5$) forms on the frontside surface and the backside surface of the silicon substrate;

subsequent to said subjecting, depositing a layer of polycrystalline silicon (polysilicon) upon the layer of phosphorus pentoxide $P_2O_5$) on the frontside surface and the backside surface of the silicon substrate; and removing the layer of polycrystalline silicon (polysilicon) and the layer of phosphorus pentoxide $P_2O_5$) from the frontside surface along with a layer of the silicon substrate immediately below the frontside surface to a depth of about 10.0 µm.

11. The method as recited in claim 10, wherein said removing step comprises etching removal of the layer of polycrystalline silicon (polysilicon) and the layer of phosphorus pentoxide ($P_2O_5$) from the frontside surface along with a layer of the silicon substrate immediately below the frontside surface to a depth of about 10.0 µm.

12. The method as recited in claim 10, wherein said removing step comprises grinding or polishing removal of the layer of polycrystalline silicon (polysilicon) and the layer of phosphorus pentoxide ($P_2O_5$) from the frontside surface along with a layer of the silicon substrate immediately below the frontside surface to a depth of about 10.0 µm.

13. A method of manufacturing a silicon substrate which optimizes extrinsic gettering during semiconductor fabrication, comprising the steps of:

subjecting a frontside surface and a backside surface of said silicon substrate to phosphorus ions in a diffusion chamber containing oxygen ($O_2$), during which a layer of phosphorus pentoxide $P_2O_5$) forms on the frontside surface and the backside surface of the silicon substrate;

subsequent to said subjecting, depositing a layer of silicon nitride upon the layer of phosphorus pentoxide $P_2O_5$) on the frontside surface and the backside surface of the silicon substrate; and removing the layer of silicon nitride and the layer of phosphorus pentoxide ($P_2O_5$) from the frontside surface along with a layer of the silicon substrate immediately below the frontside surface to a depth of about 10.0 µm.

14. The method as recited in claim 13, wherein said removing step comprises etching removal of the layer of silicon nitride and the layer of phosphorus pentoxide ($P_2O_5$) from the frontside surface along with a layer of the silicon substrate immediately below the frontside surface to a depth of about 10.0 µtm.

15. The method as recited in claim 13 wherein said removing step comprises grinding or polishing removal of the layer of silicon nitride and the layer of phosphorus pentoxide ($P_2O_5$) from the frontside surface along with a layer of the silicon substrate immediately below the frontside surface to a depth of about 10.0 µm.

* * * * *

UNITED STATES PATENT AND TRADEMARK OFFICE
CERTIFICATE OF CORRECTION

PATENT NO. : 5,789,308

DATED : August 4, 1998

INVENTOR(S) : Damon K. DeBusk; Bruce L. Pickelsimer

It is certified that error appears in the above-identified patent and that said Letters Patent is hereby corrected as shown below:

Claim 10, col. 12, line 7, please insert --(-- before $P_2O_5$.

Claim 10, col. 12, line 12, please insert --(-- before $P_2O_5$.

Claim 10, col. 12, line 15, please insert --(-- before $P_2O_5$.

Claim 13, col. 12, line 38, please insert --(-- before $P_2O_5$.

Claim 13, col. 12, line 42, please insert --(-- before $P_2O_5$.

Claim 14, col. 12, line 55, please delete "µtm" and insert therefor --µm--.

Signed and Sealed this

Twenty-seventh Day of October, 1998

Attest:

BRUCE LEHMAN

Attesting Officer

Commissioner of Patents and Trademarks